United States Patent
Lee et al.

(10) Patent No.: US 8,420,156 B2
(45) Date of Patent: Apr. 16, 2013

(54) METHOD OF FORMING PATTERN AND MANUFACTURING METHOD OF ORGANIC LIGHT EMITTING DEVICE

(75) Inventors: Hyun-Chul Lee, Yongin (KR); Jae-Seok Park, Yongin (KR); Cheol-Lae Roh, Yongin (KR); Won-Kyu Lim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 147 days.

(21) Appl. No.: 12/929,209

(22) Filed: Jan. 7, 2011

(65) Prior Publication Data

US 2011/0171397 A1 Jul. 14, 2011

(30) Foreign Application Priority Data

Jan. 12, 2010 (KR) .................. 10-2010-0002742

(51) Int. Cl.
 *B05D 1/12* (2006.01)
 *B05D 1/32* (2006.01)
 *B05D 5/06* (2006.01)

(52) U.S. Cl.
 USPC ............. 427/66; 427/199; 427/282; 427/469; 427/474; 427/598

(58) Field of Classification Search ............. 427/66, 427/199, 282, 469, 474, 598
 See application file for complete search history.

(56) References Cited

U.S. PATENT DOCUMENTS

| | | | |
|---|---|---|---|
| 6,319,541 B1 * | 11/2001 | Pletcher et al. ............. | 427/2.14 |
| 7,585,549 B2 * | 9/2009 | Lewis et al. ................. | 427/458 |
| 7,687,390 B2 * | 3/2010 | Kuriya ........................ | 438/609 |
| 2004/0062864 A1 * | 4/2004 | Langley et al. ............. | 427/250 |
| 2006/0105160 A1 * | 5/2006 | Berndt et al. ............... | 428/323 |
| 2007/0155045 A1 | 7/2007 | Seo et al. | |
| 2008/0251806 A1 * | 10/2008 | Erchak ........................ | 257/98 |
| 2009/0065741 A1 | 3/2009 | Walls et al. | |

FOREIGN PATENT DOCUMENTS

| | | |
|---|---|---|
| JP | 2006-231472 A | 9/2006 |
| JP | 2006-265650 A | 10/2006 |
| KR | 10 2003-0047284 A | 6/2003 |
| KR | 10 2007-0065620 A | 6/2007 |
| KR | 10 2008-0023488 A | 3/2008 |
| KR | 10 2009-0073467 A | 7/2009 |
| KR | 10-2009-0121036 A | 11/2009 |

* cited by examiner

*Primary Examiner* — Frederick Parker
(74) *Attorney, Agent, or Firm* — Lee & Morse, P.C.

(57) ABSTRACT

A method of forming a pattern and a method of manufacturing an organic light emitting device, the method of forming a pattern including providing an electromagnetic substrate for generating an electromagnetic field at a selectively controllable position by selectively controlling where current flows through the electromagnetic substrate; providing a patterning substrate for forming a pattern; aligning the electromagnetic substrate to a first surface of the patterning substrate; selectively applying current to the electromagnetic substrate to form the electromagnetic field at the predetermined position; providing masking powder in a vicinity of a second surface of the patterning substrate such that the masking powder reacts to the electromagnetic field; supplying a pattern forming material to the second surface of the patterning substrate; and cutting off the current to the electromagnetic substrate.

12 Claims, 5 Drawing Sheets

METHOD OF FORMING PATTERN AND MANUFACTURING METHOD OF ORGANIC LIGHT EMITTING DEVICE

BACKGROUND

1. Field

Embodiments relate to a method of forming a pattern and a method for manufacturing an organic light emitting device.

2. Description of the Related Art

Organic light emitting devices, being self-illuminating display devices, are highlighted as a next generation display device due to advantages, e.g., a wide viewing angle, a good contrast, and a fast response speed. In the organic light emitting device, an organic light emitting material forming an organic film may generally be deposited under a vacuum using a mask having a predetermined pattern. In such a method of patterning an organic film using the mask, a technique to pattern the organic film, which is a light emitting layer, is very important in manufacturing a full color organic light emitting device.

In the manufacturing process of the organic light emitting device, a large substrate may generally be used to manufacture many organic light emitting devices through a one-time, i.e., single, process. Also, as a demand for a large display increases, the size of a display itself increases as well.

SUMMARY

Embodiments are directed to a method of forming a pattern and a method for manufacturing an organic light emitting device, which represents advances over the related art.

It is a feature of an embodiment to provide a method of forming a pattern with high precision by using an electromagnetic substrate.

It is another feature of an embodiment to provide a method of forming a pattern that is suitable for forming a pattern on a large substrate.

At least one of the above and other features and advantages may be realized by providing a method of forming a pattern, the method including providing an electromagnetic substrate for generating an electromagnetic field at a selectively controllable position by selectively controlling where current flows through the electromagnetic substrate; providing a patterning substrate for forming a pattern; aligning the electromagnetic substrate to a first surface of the patterning substrate; selectively applying current to the electromagnetic substrate to form the electromagnetic field at the predetermined position; providing masking powder in a vicinity of a second surface of the patterning substrate such that the masking powder reacts to the electromagnetic field; supplying a pattern forming material to the second surface of the patterning substrate; and cutting off the current to the electromagnetic substrate.

The electromagnetic substrate may include a plurality of wires such that the current selectively flows through the plurality of wires.

The plurality of wires may be disposed in a pattern such that the electromagnetic field is formed at a position corresponding to a portion of the patterning substrate other than an area where the pattern is formed.

The masking powder may be metal powder.

The metal powder may be magnetic.

Supplying of the pattern forming material to the second surface of the patterning substrate may include depositing or sputtering the pattern forming material on the second surface of the patterning substrate.

At least one of the above and other features and advantages may also be realized by providing a method of manufacturing an organic light emitting device, the method including providing an electromagnetic substrate for generating an electromagnetic field at a selectively controllable position by selectively controlling where current flows through the electromagnetic substrate; preparing a patterning substrate having a plurality of pixel electrodes; aligning the electromagnetic substrate to a first surface of the patterning substrate; selectively applying current to the electromagnetic substrate; providing masking powder that reacts to the electric field close to at least a part of the pixel electrodes of a second surface of the patterning substrate; supplying a pattern forming material to the second surface of the patterning substrate; and cutting off the current flowing in the electromagnetic substrate.

The electromagnetic substrate may include a plurality of wires such that the current selectively flows through the plurality of wires.

The plurality of wires may be disposed in a pattern such that the electromagnetic field is formed at a position corresponding to a portion of the patterning substrate other than an area where the pattern is formed.

The masking powder may be metal powder.

The metal powder may be magnetic.

Supplying of the pattern forming material to the second surface of the patterning substrate may include depositing or sputtering the pattern forming material on the second surface of the patterning substrate.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
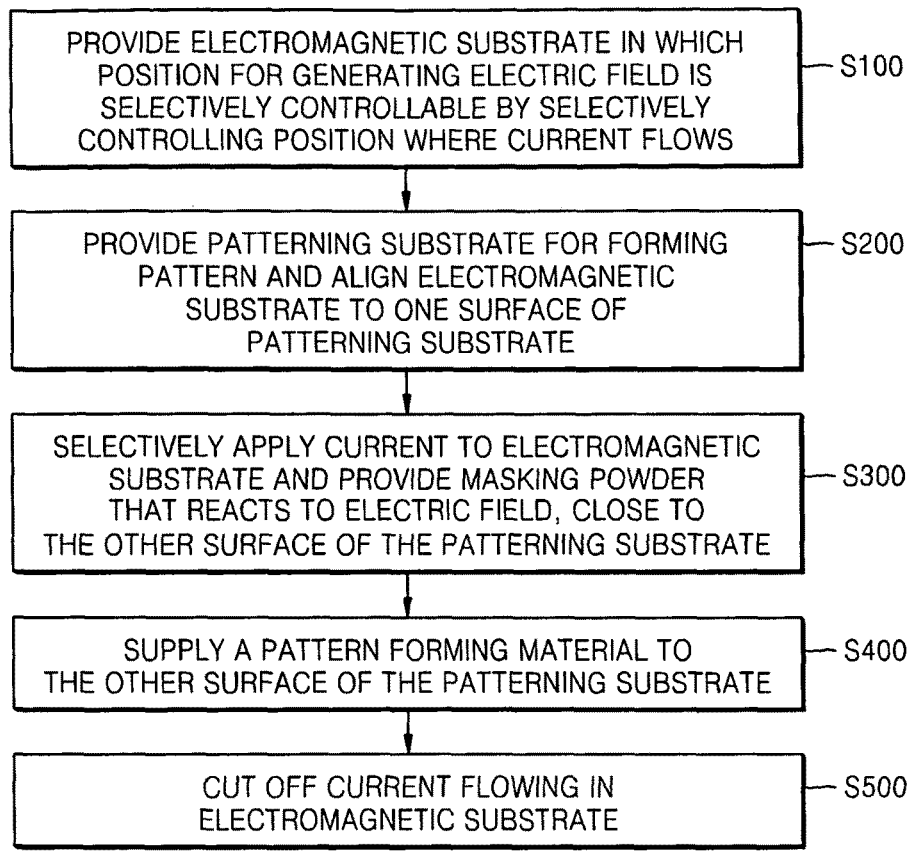
FIG. 1 illustrates a flowchart describing a method of forming a pattern according to an embodiment.

Korean Patent Application No. 10-2010-0002742, filed on Jan. 12, 2010, in the Korean Intellectual Property Office, and entitled: "Method of Forming Pattern and Manufacturing Method of Organic Light Emitting Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another element, it can be directly on the other element, or intervening elements may also be present. Like reference numerals refer to like elements throughout.

In the following description, when detailed descriptions about related well-known functions or structures are determined to make the gist of the embodiments unclear, the detailed descriptions will be omitted herein.

The terms used in the present specification are used for explaining a specific exemplary embodiment, not limiting the embodiments. Thus, the expression of singularity in the present specification includes the expression of plurality unless clearly specified otherwise in context. Also, the terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

A method of forming a pattern and a method of manufacturing an organic light emitting device according to an embodiment will be described in detail with reference to the accompanying drawings. In the following description, the same or corresponding constituent elements have the same reference numerals and repetitive descriptions will be omitted herein.

A method of forming a pattern and a method of manufacturing an organic light emitting device according to an embodiment will be described with reference to FIGS. 1-8. FIG. 1 illustrates a flowchart describing a method of forming a pattern according to an embodiment. FIGS. 2-8 illustrate stages in a method for forming a pattern according to an embodiment.

Figure 2:
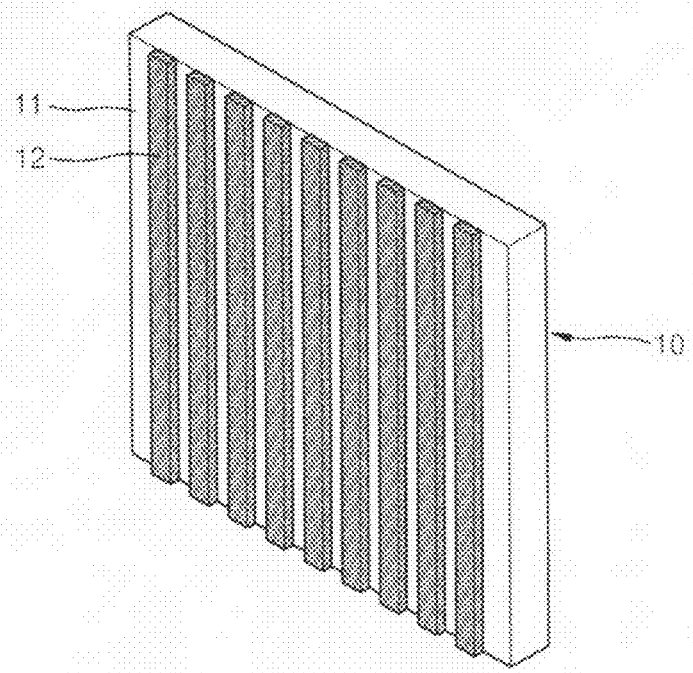
FIGS. 2-8 illustrate stages in a method for forming a pattern according to an embodiment.

First, referring to FIG. 2, an electromagnetic substrate 10 may be provided (S100). The electromagnetic substrate 10 may be a device for generating an electromagnetic field according to a flow of current. The electromagnetic field generated in the electromagnetic substrate 10 may be controlled by controlling the flow of current. According to the present embodiment, as illustrated in FIG. 2, the electromagnetic substrate 10 may have a structure in which a plurality of wires 12 are coupled to a substrate 11. The wires 12 may be, e.g., attached to the substrate 11, wound around the substrate 11, or embedded in the substrate 11. The substrate 11 may be formed of a material for forming the electromagnetic field by the wires 12 attached thereto. Current may independently flow through the wires 12 and the current flow may be selectively controlled by a user.

A position where the current flows may be selectively controlled by the electromagnetic substrate 10. Accordingly, the electromagnetic field generated in the electromagnetic substrate 10 may be selectively generated at a position corresponding to the current flowing position. A magnitude of the electromagnetic field generated in the electromagnetic substrate 10 may be adjusted according to, e.g., a thickness of the wires 12 coupled to the electromagnetic substrate 10 or an amount of current flowing through the wires 12. That is, as the wires 12 become thicker or the amount of current flowing through the wires 12 increases, the magnitude of the electromagnetic field selectively generated in the electromagnetic substrate 10 may be increased.

The pattern of the wires 12 may be formed in relation to a desired pattern to be formed on a patterning substrate 20 which will be described below.

Figure 3:
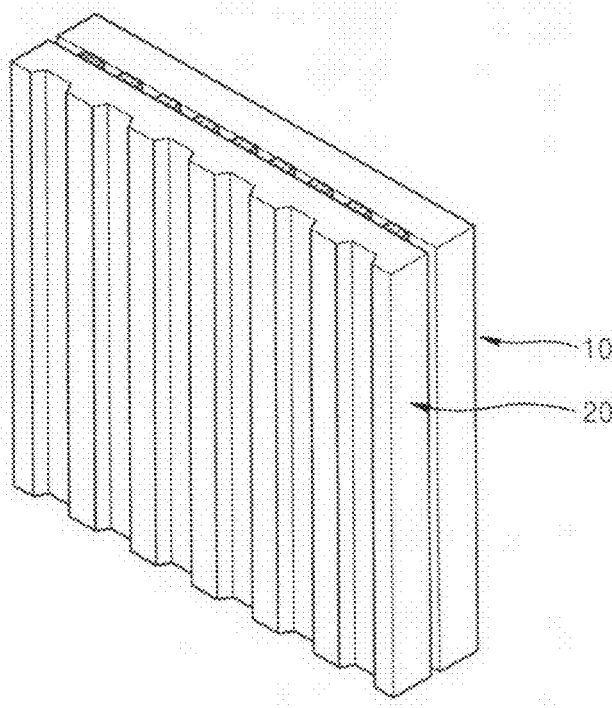

The patterning substrate 20 having a pattern as illustrated in FIG. 3 may be provided and the above-described electromagnetic substrate 10 may be aligned to one, i.e., a first, surface of the patterning substrate 20 (S200). According to the present embodiment, the patterning substrate 20 may include, e.g., a low temperature polysilicon (LTPS) substrate that may be used to manufacture an organic light emitting device (OLED). In an implementation, the LTPS substrate may be a large substrate in which a plurality of OLEDs may be formed and may be the patterning substrate 20 where a pattern layer of an organic compound may be formed by a below-described process.

Figure 4:
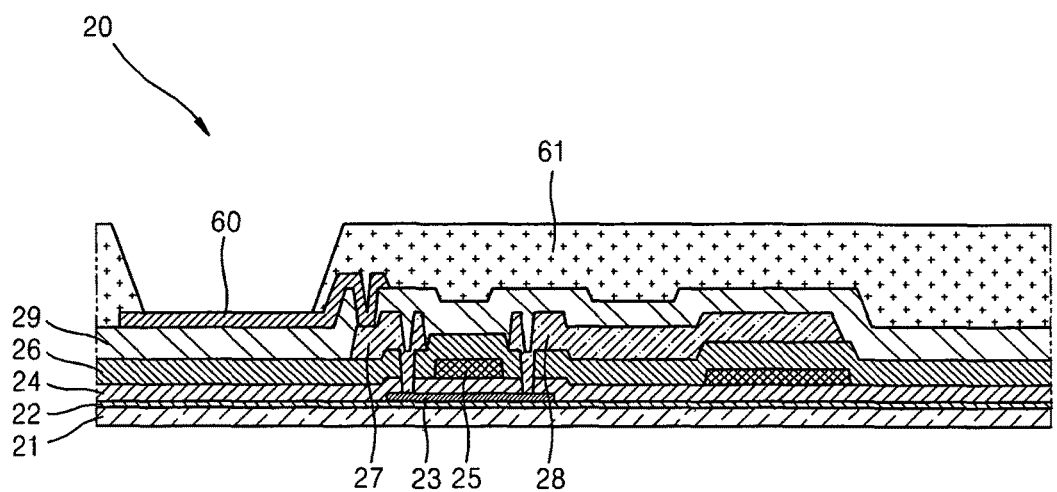

FIG. 4 illustrates a detailed example of the patterning substrate 20. Referring to FIG. 4, an organic light emitting layer (not illustrated) may be patterned on a pixel electrode 60 such that an active matrix (AM) type OLED may be fabricated by using the patterning substrate 20. In the patterning substrate 20 according to the present embodiment, a buffer insulation layer 22 may be deposited on glass 21, an active layer 23 may be formed on the buffer insulation layer 22, and the active layer 23 may be covered with a gate insulation layer 24. The active layer 23 may have a poly-Si structure after a-Si is deposited and then a crystallization process is performed.

A gate electrode 25 may be formed on the gate insulation layer 24. An interlayer insulation layer 26 may be deposited on the gate electrode 25 and the gate insulation layer 24. A drain electrode 27 and a source electrode 28 may penetrate the interlayer insulation layer 26 to contact the active layer 23 and may be covered with a passivation layer 29. The drain electrode 27 may be connected to the pixel electrode 60 formed on the passivation layer 29 to transfer an output voltage of a thin film transistor (TFT).

A pixel definition layer 61 may be formed on top of the stacked substrate to expose the pixel electrode 60. An organic light emitting layer (not shown) may be patterned on an opened portion of the pixel electrode 60. After the organic light emitting layer is patterned, a second electrode (not shown) may be formed on the organic light emitting layer in a direction to cross the pixel electrode 60, thereby completing the OLED. In the present embodiment, as illustrated in FIG. 4, the patterning substrate 20 may be used in a state before the organic light emitting layer is patterned; and the organic light emitting layer may be formed on the open portions of the pixel electrode 60 in a pattern forming process that will be described below. In particular, as illustrated in FIG. 4, a bottom surface of the patterning substrate 20 may be the first surface and a top surface thereof may be another, i.e., second, surface.

The electromagnetic substrate 10 may be aligned on the first surface of the patterning substrate 20, as illustrated in FIG. 3. The electromagnetic substrate 10, e.g., the wires 12, may be aligned to correspond to a position of a desired pattern to be formed on the second surface of the patterning substrate 20 and, also, to have an electric field generated by the electromagnetic substrate 10 formed on the second surface of the patterning substrate 20.

Figure 5:
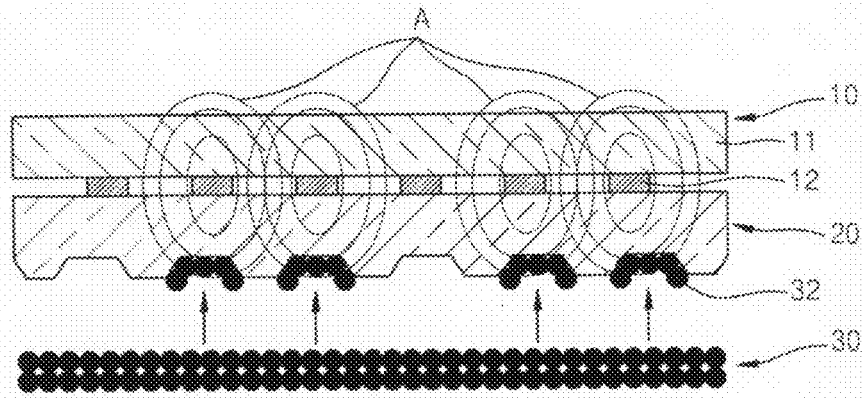

Then, as illustrated in FIG. 5, current may be selectively applied to the electromagnetic substrate 10, e.g., the wires 12, and masking powder 30 may be provided close to the second surface of the patterning substrate 20 (S300). When the patterning substrate 20 and the electromagnetic substrate 10 are aligned, as current is selectively applied to the electromagnetic substrate 10, an electromagnetic field may be formed only at positions A corresponding to the position where the current flows as illustrated in FIG. 5. The masking powder 30 may be provided to the second surface of the patterning substrate 20 where the electromagnetic field is partially formed. As the masking powder 30 is provided close to the second surface of the patterning substrate 20, the masking powder 30 may react to, i.e., be attracted to, the electromagnetic field such that the masking powder 30 adheres to the patterning substrate 20 only at the positions where the electromagnetic field is formed as illustrated in FIG. 5. The masking powder 30 may form a shield portion 32, i.e., mask, for a deposition or sputtering process that will be described below. Thus, the masking powder 30 may adhere to a portion of the patterning substrate 20 in the pattern of the wires 12 having current flowing therethrough. That is, the electromagnetic field may be activated in a portion of the electromagnetic substrate 10 corresponding to a portion of the patterning substrate 20 other than where the desired pattern to be formed on the patterning substrate 20, i.e., portions where a material is to be deposited may not be exposed to the electric field.

The masking powder 30 may be formed of a material capable of reacting to the electromagnetic field and capable of performing as a mask to prevent formation of a pattern in a pattern formation process. In an implementation, the masking powder 30 may be metal powder exhibiting magnetism, which adheres to the patterning substrate 20 due to the electromagnetic field, and blocks the deposition of a pattern forming material 40 directly on the patterning substrate 20. The metal powder may have a fine particle size corresponding to a size of a pattern to be formed. The metal powder may be reused by being easily removed without contaminating the patterning substrate 20 after the patterning process. The masking powder 30 may not need to form a thick layer and a thickness capable of blocking the pattern forming material may suffice.

Figure 6:
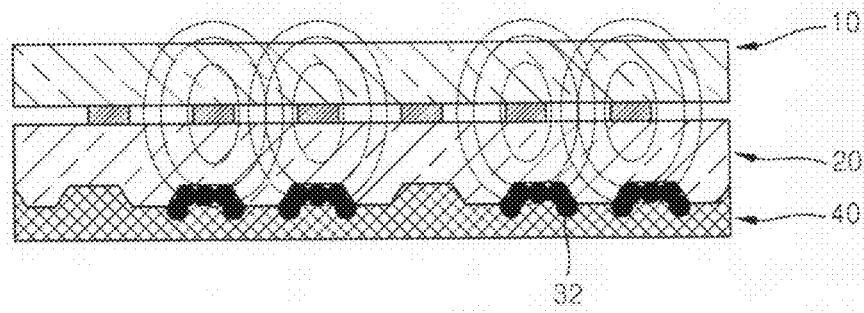
Figure 7:
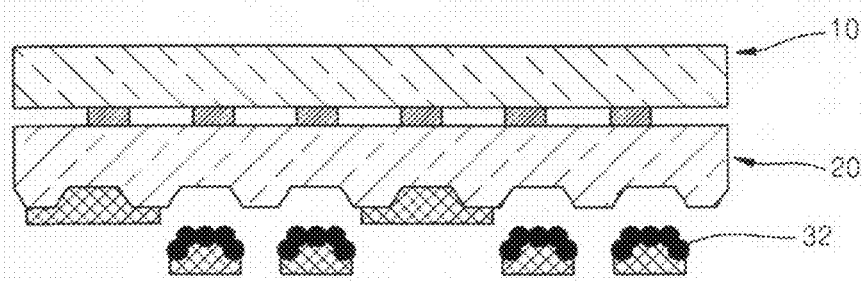

Next, as illustrated in FIG. 6, the pattern forming material 40 may be supplied to the second surface of the patterning substrate 20 (S400). The pattern forming material 40 may be coupled to a portion of the surface of the patterning substrate 20 where the shield portion 32 is not formed, thereby forming a pattern. According to the present embodiment, the pattern forming material 40 may be an organic compound for forming an organic light emitting layer on an LTPS substrate. In particular, a light emitting layer material emitting any one of red, green, and blue light to represent color of the OLED may be selected as the organic compound. The color represented by the OLED may be determined according to the selected organic compound. The pattern forming material 40, e.g., the organic compound, may be supplied to the second surface of the patterning substrate 20 using, e.g., a deposition or sputtering method. While the pattern forming material 40 may be, e.g., vacuum deposited or sputtered, on the surface of the patterning substrate 20 including where the shield portion 32 is formed, the pattern forming material 40 may only remain on the surface of the patterning substrate 20 where the shield portion 32 is not formed, as will be described below. FIG. 6 illustrates that the pattern forming material may be formed on the surface of the patterning substrate 20 by a deposition or sputtering method.

After the supplying of the pattern forming material 40 is completed as described above, as illustrated in FIG. 7, the current flowing in the electromagnetic substrate 10 may be cut off (S500). The shield portion 32 on the surface of the patterning substrate 20, which prevents deposition of the pattern forming material 40 as the current selectively flows by partially forming the electromagnetic field, may be separated from the patterning substrate 20 when the current is cut off. Thus, the pattern forming material 40 on the shield portion 32 may be separated from the patterning substrate 20. Accordingly, a pattern 50 may be formed by this process only in the portion of the patterning substrate 20 where the shield portion 32 is not formed.

Figure 8:
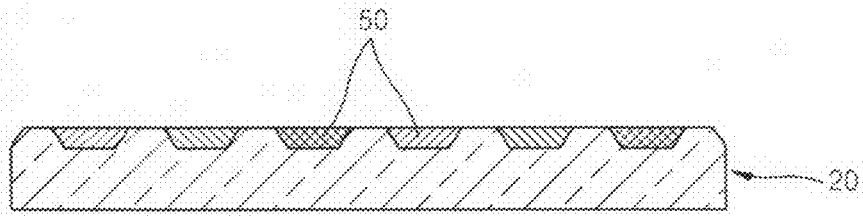

By repeating the above-described processes illustrated in FIGS. 2-7, a plurality of patterns 50 may be selectively formed in a desired portion of the patterning substrate 20 as illustrated in FIG. 8. A material for forming the pattern 50 may be selected as necessary, i.e., depending on the desired color of the pixel being formed.

When one of red, green, and blue light emitting layers of the OLED is formed in the above method, the wires 12 may be formed in a pattern corresponding to all red, green, and blue pixels. Thus, to form a red light emitting layer, current may be applied to the wires 12 corresponding to the green and blue pixels, facilitating deposition of the red light emitting layer only on portions of the patterning substrate where a red pixel is desired. To form a green light emitting layer, current may be applied to the wires 12 corresponding to the red and blue pixels, facilitating deposition of the green light emitting layer only on portions of the patterning substrate where a green pixel is desired. To form a blue light emitting layer, current may be applied to the wires 12 corresponding to the red and green pixels, facilitating deposition of the blue light emitting layer only on portions of the patterning substrate where a blue pixel is desired. As a result, the red, green, and blue light emitting layers may be sequentially formed.

In the above description of the embodiments, the process for forming the pattern 50 of an organic layer of an OLED is described. In manufacturing the OLED, since the organic layer may be sensitive to moisture, the organic layer should be completely isolated from moisture during and after the manufacturing process. Accordingly, a photolithography method in which the organic layer is exposed to moisture in a resist separation process and an etching process may not be suitable for the process for forming an organic layer pattern. Thus, the embodiments may be effectively employed for manufacturing a large OLED, because the organic layer may be patterned without contacting moisture and a mask sagging phenomenon may be prevented.

The above-described pattern forming process may be applied in various ways to the pattern forming process in which a wet process is difficult to employ. That is, the embodiments may be employed in a process for forming a circuit pattern of a printed circuit board by using a conductive pattern forming material to the patterning substrate formed of an insulation material. Also, the embodiments may be employed to a process for forming a pattern by using a mask in a deposition or sputtering method.

Without the method described herein, a large substrate may sag during the deposition process due to gravity as the size thereof increases. With this method, however, the degree of precision of a pattern may be increased when the organic light emitting material is deposited.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a pattern, the method comprising:
   aligning an electromagnetic substrate to a first surface of a substrate to be pattern coated, the electromagnetic substrate generating an electromagnetic field at a selectively controllable position by selectively controlling where current flows through the electromagnetic substrate;
   selectively applying current to the electromagnetic substrate to form the electromagnetic field in a predetermined pattern;
   providing masking powder on to a second surface of the substrate to be pattern coated such that the masking powder is applied to the second surface according to the predetermined pattern of the electromagnetic field to form a powder mask pattern;
   applying a pattern forming material to the second surface substrate to be pattern coated having the powder mask pattern thereon; and
   cutting off the current to the electromagnetic substrate.

2. The method as claimed in claim 1, wherein the electromagnetic substrate includes a plurality of wires such that the current selectively flows through the plurality of wires.

3. The method as claimed in claim 2, wherein the plurality of wires are disposed in a pattern such that the electromagnetic field is formed at a position corresponding to a portion of the substrate to be pattern coated other than an area where the pattern is formed when the current selectively flows through the plurality of wires.

4. The method as claimed in claim 1, wherein the masking powder is metal powder.

5. The method as claimed in claim 4, wherein the metal powder is magnetic.

6. The method as claimed in claim 1, wherein applying the pattern forming material to the second surface of the substrate to be pattern coated includes depositing or sputtering the pattern forming material on the second surface of the substrate to be pattern coated.

7. A method of manufacturing an organic light emitting device, the method comprising:
   preparing a substrate to be pattern coated having a plurality of pixel electrodes;
   aligning an electromagnetic substrate to a first surface of the substrate to be pattern coated, the electromagnetic substrate generating an electromagnetic field at a selectively controllable position by selectively controlling where current flows through the electromagnetic substrate;
   selectively applying current to the electromagnetic substrate to form the electromagnetic field in a predetermined pattern;
   providing masking powder on to at least a part of the pixel electrodes of a second surface of the substrate to be pattern coated, such that the masking powder is applied to the second surface according to the predetermined pattern of the electromagnetic field to form a powder mask pattern;
   applying a pattern forming material to the second surface substrate to be pattern coated having the powder mask pattern thereon; and
   cutting off the current flowing in the electromagnetic substrate.

8. The method as claimed in claim 7, wherein the electromagnetic substrate includes a plurality of wires such that the current selectively flows through the plurality of wires.

9. The method as claimed in claim 8, wherein the plurality of wires are disposed in a pattern such that the electromagnetic field is formed at a position corresponding to a portion of the substrate to be pattern coated other than an area where the pattern is formed when the current selectively flows through the plurality of wires.

10. The method as claimed in claim 7, wherein the masking powder is metal powder.

11. The method as claimed in claim 10, wherein the metal powder is magnetic.

12. The method as claimed in claim 7, wherein applying the pattern forming material to the second surface of the substrate to be pattern coated includes depositing or sputtering the pattern forming material on the second surface of the substrate to be pattern coated.

* * * * *